United States Patent [19]
Bannai et al.

[11] Patent Number: 6,078,188
[45] Date of Patent: *Jun. 20, 2000

[54] SEMICONDUCTOR DEVICE TRANSPORTING AND HANDLING APPARATUS

[75] Inventors: Kuniaki Bannai, Saitama; Koichi Tanaka, Gyoda, both of Japan

[73] Assignee: Advantest Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/817,759

[22] PCT Filed: Aug. 30, 1996

[86] PCT No.: PCT/JP96/02445

§ 371 Date: Apr. 28, 1997

§ 102(e) Date: Apr. 28, 1997

[87] PCT Pub. No.: WO97/09629

PCT Pub. Date: Mar. 13, 1997

[30] Foreign Application Priority Data

Sep. 4, 1995 [JP] Japan .................................. 7-226494

[51] Int. Cl.[7] .......................... G01R 31/26; B65G 49/07; B07C 5/344
[52] U.S. Cl. ................. 324/765; 324/158.1; 364/478.02; 364/478.11; 414/935; 209/573
[58] Field of Search ..................................... 324/760, 765, 324/158.1; 364/478.01, 478.02, 478.11, 478.16; 269/903; 414/935; 209/573

[56] References Cited

U.S. PATENT DOCUMENTS

| | | | |
|---|---|---|---|
| 3,584,741 | 6/1971 | Schirmer | 209/573 |
| 3,664,499 | 5/1972 | Sahakian | 209/573 |
| 4,755,746 | 7/1988 | Mallory et al. | 324/766 |
| 4,911,629 | 3/1990 | Fujita | 425/135 |
| 5,307,011 | 4/1994 | Tani . | |
| 5,313,156 | 5/1994 | Klug et al. . | |
| 5,650,732 | 7/1997 | Sakai | 324/760 |
| 5,812,409 | 9/1998 | Kanno et al. | 364/478.01 |

FOREIGN PATENT DOCUMENTS

| | | |
|---|---|---|
| 3-97676 | 10/1991 | Japan . |
| 5-188119 | 7/1993 | Japan . |
| 6-027194 | 2/1994 | Japan . |
| 6-148273 | 5/1994 | Japan . |
| 6-281692 | 10/1994 | Japan . |
| 6-019638 | 1/1995 | Japan . |
| 7-030614 | 1/1995 | Japan . |
| 7-092224 | 4/1995 | Japan . |
| 7-218581 | 8/1995 | Japan . |

*Primary Examiner*—Glenn W. Brown
*Attorney, Agent, or Firm*—Staas & Halsey LLP

[57] ABSTRACT

A handler is provided in which an operator can easily input test conditions for ICs of a lot. The handler includes a test parameter memory part, a parameter set memory part, a schedule memory part, a lot data memory part, a retest data memory part, and a control. The test parameter memory part restores, as the test conditions for the ICs to be tested of each lot, at least parameters of basic conditions of operation, parameters of classifying conditions for the tested devices, at least one parameter of socket selecting conditions in the test section, and parameters of temperature conditions for the constant temperature chamber. The parameter set memory part stores a plurality of parameter sets each set of which is a combination of parameters, one for one condition stored in the test parameter memory part. The schedule memory part stores a name of each lot, and a parameter set and a status corresponding to each lot name in testing sequence. The lot data memory part stores data of the test results for each lot. The retest data memory part stores retest data including a parameter set for devices to be retested. The control controls various sections and parts of the handler. Various parameter sets usually used are previously stored in the parameter set memory part.

13 Claims, 8 Drawing Sheets

8b PARAMETER SET MEMORY PART

| PARAMETER SET NAME | CONTENTS |
|---|---|
| $S_1$ | $A_1$ $B_1$ $C_1$ $D_1$ - - - - |
| $S_2$ | $A_1$ $B_1$ $C_1$ $D_2$ - - - - |
| $S_3$ | $A_1$ $B_1$ $C_2$ $D_1$ - - - - |
| ⋮ | |

FIG. 2A

8c SCHEDULE MEMORY PART

| No. | NAME OF LOT | STATUS | TEST CONDITION | NO. OF DEVICES |
|---|---|---|---|---|
| 1 | AAA-1 | TESTED | $S_1$ | 500 |
| 2 | BBB-1 | TESTED | $S_2$ | 500 |
| 3 | CCC-1 | UNDER TEST | $S_3$ | 1000 |
| 4 | AAA-2 | UNTESTED | $S_1$ | 500 |
| 5 | BBB-2 | UNTESTED | $S_2$ | 500 |
| ⋮ | | | | |

FIG. 2B (INTERRUPT)     8c SCHEDULE MEMORY PART

| No. | LOT NAME | STATUS | TEST CONDITION | NO. OF DEVICES |
|---|---|---|---|---|
| 1 | AAA−1 | TESTED | $S_1$ | 500 |
| 2 | BBB−1 | TESTED | $S_2$ | 500 |
| 3 | CCC−1 | TESTED | $S_3$ | 1000 |
| 4 | DDD−1 | UNTESTED | $S_4$ | 2000 |
| 5 | AAA−2 | UNTESTED | $S_1$ | 500 |
| ⋮ | | | | |

FIG. 4A (RETEST)     8c

| No. | LOT No. | PROCESS | TEST CONDITION | NO. OF DEVICES |
|---|---|---|---|---|
| 4 | DDD−1 | ENDED | $S_4$ | 2000 |
| 5 | REDDD−1 | UNENDED | | 200 |
| 6 | AAA−2 | UNENDED | $S_1$ | 500 |
| ⋮ | | | | |

$S_4$ OR RETESTING DATA

FIG. 4B

| TEST CONDITION | PARAMETERS (CLASSIFICATION) |
|---|---|
| BASIC CONDITIONS OF OPERATION | $A_1$<br>$A_2$<br>$A_3$<br>$\vdots$ |
| CLASSIFYING CONDITIONS | $B_1$<br>$B_2$<br>$\vdots$ |
| SOCKET SELECTING CONDITIONS | $C_1$<br>$C_2$<br>$\vdots$ |
| TEMPERATURE CONDITIONS | $D_1$<br>$D_2$<br>$\vdots$ |

FIG. 8
PRIOR ART

| NAME OF LOT | TEST CONDITION | DATA FILES FOR TEST |
|---|---|---|
| LOT a | $A_1$ $B_1$ $C_1$ $D_1$ --- | FILE a |
| LOT b | $A_1$ $B_2$ $C_1$ $D_1$ --- | FILE b |
| LOT c | $A_1$ $B_1$ $C_2$ $D_1$ --- | FILE c |
| LOT d | $A_1$ $B_1$ $C_2$ $D_2$ --- | FILE d |
| $\vdots$ | $\vdots$ | $\vdots$ |
| LOT n | $A_2$ $B_3$ $C_3$ $D_4$ | FILE n |

FIG. 9
PRIOR ART

SEMICONDUCTOR DEVICE TRANSPORTING AND HANDLING APPARATUS

BACKGROUND OF THE INVENTION

1. Field of the Invention

The present invention relates to a semiconductor device transporting and handling or processing apparatus (commonly referred to as handler) which is mounted to a semiconductor device testing apparatus (commonly referred to as IC tester) for testing a semiconductor device such as a semiconductor integrated circuit (hereinafter referred to as IC) which is typical of the semiconductor devices.

2. Background of the Related Art

Many of semiconductor device testing apparatus (hereinafter referred to as IC tester) for measuring or determining the electrical characteristics of semiconductor devices by applying a test signal of a predetermined pattern to the devices to be tested have a semiconductor device transporting and handling or processing apparatus (hereinafter referred to as handler) integrally connected thereto. The handler is adapted for transporting semiconductor devices to be tested to a test or testing section where the devices are brought into electrical contact with a tester head of the IC tester for testing, and upon completion of the test in the test section, carrying the tested devices out of the test section, and sorting out the tested devices on the basis of the test results. For clarity of the explanation, the following description will be discussed with reference to ICs which are a typical example of semiconductor devices, but it is needless to say that the present invention can be also applied to semiconductor devices other than ICs.

At first, the outline of the construction and operation of an example of the prior art handler called "horizontal transporting system" will be described with reference to FIGS. 5 and 6. As is shown in the form of a flow chart in FIG. 5, the illustrated handler 30 comprises a loader section 3 where ICs 33 to be tested which a user has beforehand loaded on a customer tray (general-purpose tray) 31 are transferred and reloaded onto a test tray 32 capable of withstanding high/low temperatures, a constant temperature or thermostatic chamber 34 including a test section 2 for receiving and testing the ICs from the loader section 3, and an unloader section 4 where the tested ICs 33 which have been carried on the test tray 32 out of the constant temperature chamber 34 subsequently to undergoing a test in the test section 2 are transferred from the test tray 32 to the customer tray 31 to be reloaded on the latter (generally, the tested ICs are often sorted out by categories based on the data of the test results and transferred onto the corresponding customer trays.) Depending upon the type of ICs to be tested (in the case of the surface mount type ICs or the like each packaged in a dual-in-line flat package, for example), each IC may be loaded on an IC carrier, and then the IC carrier loaded with the IC may be placed on a customer tray.

The test tray 32 is moved in a circulating manner from and back to the loader section 3 sequentially through the constant temperature chamber 34 and the unloader section 4. More specifically, the test tray 32 loaded with ICs 33 to be tested is transported from the loader section 3 to a heating/cooling chamber 35 called soak chamber within the constant temperature chamber 34 where the ICs 33 placed on the tray 32 are heated or cooled to a predetermined constant temperature. Generally, the soak chamber 35 is adapted to store a plurality of (say, nine) test trays 14 stacked one on another such that a test tray 32 newly received from the loader section 3 is stored at the top of the stack while the lowermost test tray is delivered to the test section 2. The ICs 33 to be tested are heated or cooled to a predetermined constant temperature while the test tray 32 is moved from the top to the bottom of the stack within the soak chamber 35. The heated or cooled ICs 33 together with the test tray 32 are then transported while maintained at the constant temperature from the soak chamber 35 to the test section 2 where the ICs to be tested are brought into electrical contact with IC sockets (not shown) disposed in the test section 2 to be measured for their electric characteristics. Upon completion of the test, the tested ICs 33 are transported from the test section 2 to an exit chamber 36 where they are restored to the ambient temperature. Like the soak chamber 35, the exit chamber 36 is also adapted to accommodate test trays in the form of a stack. For example, the arrangement is such that the tested ICs 33 are brought back to the ambient temperature as the associated test tray is moved sequentially from the bottom to the top of the stack within the exit chamber 36. Thereafter, the tested ICs 33 as carried on the test tray 32 are passed to the unloader section 4 where the tested ICs are sorted out by categories based on the data of the test results and transferred onto the corresponding customer trays 31. The test tray 32 emptied in the unloader section 4 is delivered back to the loader section 3 where it is again loaded with ICs 33 to be tested from the customer tray 31 to repeat the same steps of operation.

While the handler 30 illustrated in FIG. 5 is of the type which is configured to transport ICs to be tested as placed on the tray, handlers of the type adapted to transport ICs to be tested individually are also currently used.

As is shown in FIG. 6, the loader section 3 comprises a storage or rack section 3a (hereinafter referred to as rack section) for storing a plurality of customer trays 31 each loaded with ICs 33 to be tested thereon stacked one on top of another, a tray transporting section 3c for transporting the customer tray 31 loaded with ICs to be tested thereon from the rack section 3a to a transfer stage in the loader section 3, and a device transferring section 3b for transferring the ICs 33 to be tested loaded on the customer tray 31 onto a test tray 32 in the transfer stage. The unloader section 4 comprises a device transferring section 4b for transferring the tested ICs carried on the test tray 32 and transported from the test section 2 to a transfer stage in the unloader section 4 onto a customer tray 31, a storage or rack section 4a (hereinafter referred to as rack section) for storing a plurality of customer trays 31 each loaded with tested ICs thereon stacked in one on another, and a tray transporting section 4c for transporting the customer tray 31 loaded with tested ICs thereon from the transfer stage to the rack section 4a.

It is to be noted that in the device transferring section 3b for transferring the ICs to be tested from the customer tray 31 to the test tray 32 in the loader section 3, and in the device transferring section 4b for transferring the tested ICs from the test tray 32 to the customer tray 31 in the unloader section 4 are used suction transport means utilizing a vacuum pump which may pick up one to several ICs at a time for the transfer.

In addition, the ICs 33 to be tested are rendered to be in connection with IC sockets (contact pins) in the test section 2 to which a test signal of a predetermined pattern is applied from the IC tester 1 for undergoing a test for their electrical characteristics. The test section 2 of the handler is disposed inside the constant temperature chamber 34 to meet the requirement that ICs to be tested be tested in an atmosphere at a specified predetermined temperature, and the IC sockets are disposed inside the constant temperature chamber 34 in a thermally insulated condition.

In the illustrated example, the test section 2 is so arranged that those in odd-numbered rows, for example, of the ICs to be tested carried on the test tray 32 are first tested, followed by those in even-numbered rows being tested. For this reason, two test trays 32 are shown in the test section 2. This is because the number of ICs to be tested at one time by an IC tester is limited (say, up to thirty-two), while too many (sixty-four, for example) ICs to be tested at one time are carried on one test tray in this example.

One test tray 32 is formed to be able to accommodate, in this example, the total of sixty-four ICs arrayed in 4 lines×16 rows (columns). Accordingly, IC sockets are disposed in two groups in the test section 2, one of the groups consisting of thirty-two sockets arrayed in 4 lines×8 rows for ICs to be tested in odd-numbered rows and the other consisting of thirty-two sockets arrayed in 4 lines×8 rows for ICs to be tested in even-numbered rows. Also, the tester head 1a may have sixteen IC sockets mounted thereon and arrayed in 4 lines×4 rows so that when the ICs to be tested are loaded on one test tray 32 with 4 lines×16 rows as depicted in FIG. 7, the ICs of each line and every four rows (the total 16 ICs of each line and the first row, the fifth row, the ninth row and the thirteenth row as indicated by oblique lines in FIG. 7) can be connected with the 16 IC sockets, respectively, at one time. That is, a first test is conducted on 16 ICs on the rows 1, 5, 9 and 13 of each line, then a second test is conducted on 16 ICs on the rows 2, 6, 10 and 14 of each line after the test tray 32 is moved by one row and the subsequent tests are similarly carried out on the remaining ICs.

It is also to be noted that there is still another type of handler in which ICs to be tested are transferred from the test tray into a socket for testing and upon the test being completed the ICs are transferred from the socket back onto the test tray, in the test section 2.

The general trend in recent years is toward the use of handlers of the horizontal transporting system as described above, and ICs 33 to be tested loaded on the test tray 32 are transported to the test section 2 by the handler 30, and upon completion of the test, the tested ICs 33 as carried on the test tray 32 are transported from the test section 2 to the unloader section 4 where the tested ICs are sorted out by categories based on the data of the test results and transferred from the test tray 32 onto the corresponding customer trays 31 for storage therein. In testing the electric characteristics of ICs, after the first time regular test is completed on all of the ICs in a lot or batch to be tested, it may be desirable to immediately retest a certain category or categories in characteristics of ICs, or to retest them at a later appropriate time, depending on the results of the first test.

However, there were no alternatives or mechanisms in the prior art handlers to manually carry the tested ICs desired to be retested from the unloader section 4 to the loader section 2. It is thus to be understood that when it is desired to retest the tested ICs of the same lot which were finished with the first time regular run of test and which were then classified by categories with respect to the characteristics on the basis of the test results and stored in a rack 4a together with customer trays 31 in the unloader section 4, it was heretofore impossible to carry out the retest automatically without relying on the transportation by hand of the operator.

Examples of the cases where the user desires to have the tested ICs retested may include:

(1) the case where in view of the results classified by the characteristics testing standards for the first time test, it is desired to effect the test by the further subdivided characteristics testing standard items;

(2) the case where it is desired to test and sort ICs by the test standards regarding a certain set of characteristics during the first time test and then to test and sort them by the test standards regarding another set of characteristics during the second time test; and (3) the case where it is desired to retest merely because the testing and sorting were carried out on the basis of the erroneously set test standards or because there are some doubtful or unconvincing points about the test results.

As described above, the ICs which have undergone the first time test are sorted into typically two to eight categories on the basis of the test results in the unloader section 4. Generally, it is at the discretion of the operators of the various IC manufacturers to determine the number of categories depending on the purpose. When there are two categories, they are categories of "conforming or conformable article" and "non-conforming or unconformable article". It is usual, however, to use the classification according to more than four categories. For, example, those of the tested ICs which exhibit the best test data on the performance specification may be classified into the category $B_1$, those showing good results be the category $B_2$, those reaching the lowest acceptable limit of the performance specification be the category $B_3$, and those found defective be the category $B_4$. Those of the categories $B_1$ and $B_2$ may be labeled conforming article for which a retest is not required while those of the categories $B_3$ and $B_4$ may be labeled non-conforming article or articles required to be retested. When the classification is made into eight categories, it takes a considerably long time to conduct the classification because the performance specification must be divided into eight grades.

It is heretofore a common practice to ship the tested ICs determined to be conforming articles as such while those labeled non-conforming article are all subjected to retest. The second test is carried out on different test items or according to different classification categories or under the same conditions of measurement as for the first time test, in order to detect final non-conforming articles. For this reason, those of the tested IC determined to be non-conforming article in the first time test are usually all in a group subjected to the second test. Taking the aforesaid four-category classification by way of example, the tested ICs classified under the categories $B_3$ and $B_4$ are all together retested. This means that it would be a waste of time and uselessly prolong the testing time to sort non-conforming articles by categories in the unloader section 4 after the first test. Accordingly, there is a need for improving the efficiency of the testing apparatus which is an expensive equipment and reducing the operating cost by reducing the testing time to any extent.

In the test section 2, on the other hand, as described above, the ICs 33 to be tested undergo a test for their electric characteristics while they are electrically connected with IC sockets (not shown) mounted on the tester head 1a of the IC tester 1 disposed in the test section 2. With an increase in the capacity and integration level of IC in recent years, the testing time required per an IC gets longer and longer, resulting in requiring a vast total time for testing all ICs of a lot or batch to be tested. In an attempt to reduce the total testing time it is a popular practice to use a method of testing a large number of ICs at a time. To this end, numerous sockets (for instance, sixteen or thirty-two) are mounted on the tester head 1a of the IC tester 1 as indicated above. In this connection, it is to be noted that the contact pins of each of the sockets on the tester head 1a are brought into mechanical contact with the IC to be tested so many times that they may possibly be deformed, and that the contact characteristics of the contact pins of the sockets are measured immediately before the test is started because any IC under test may be labeled non-conforming due to poor contact between the leads of the IC and the contact pins of the socket.

In case all of the ICs in each lot are tested using the handler 30 as described above, it is necessary to set beforehand to the handler (1) basic conditions of operation, (2) classifying conditions, (3) socket selecting conditions, (4) temperature conditions, and (5) other conditions. It is considered that the basic conditions of operation may include (a) a condition for giving an alarm, (b) setting of an external shape and a capacity of a tray used, (c) setting of a type or kind and an external shape of an IC to be tested, and the like, and the classifying conditions may include setting of how to classify the tested ICs based on the test results. For example, it is considered to mainly sort out the tested ICs into two groups of "conforming articles (pass articles)" and "non-conforming articles (failure articles)", or to finely sort out them into "conforming articles A", "conforming articles B", "conforming articles C", and "non-conforming articles", etc., as described above. Also, it is considered that the socket selecting conditions may include specifying a socket (contact pin) which is inhibited from being used such as specifying a defective socket among sixteen or thirty-two sockets. Further, it is considered that the temperature conditions may include a plurality of different temperature cycles set in the constant temperature chamber upon testing, or the like. FIG. 8 illustrates a classification (parameters) of these test conditions in a table.

In order to set the test conditions stated above to the handler 30 and also to control respective sections and portions of the handler, the test section 2, the loader section 3 and the unloader section 4 of the handler 30 are connected to an input/output (I/O) interface part 5 as shown in FIG. 6. Also, the IC tester 1 is connected to this I/O interface part 5, and further a control part (CPU) 6 for controlling various operations and functions of the handler 30 and the IC tester 1, a ROM (Read Only Memory) 7 for storing a system program and the like, and a RAM (Random Access Memory) 8 are connected to the I/O interface part 5 through a bus 9. In addition, a keyboard 10 as an input device by which an operator can input the above-mentioned test conditions, program, etc., an external memory part 11 such as a hard disk, a floppy disk or the like, a display 12, and a printer 13 are connected to the I/O interface part 5.

In the prior art handler thus constructed, an operator has previously written the test conditions for each lot with reference to a process table into the external memory part 11 (for instance, a floppy disk) as a data file using the keyboard 10, and before a test is commenced for ICs of each lot, the operator inputs a corresponding data file from the floppy disk 11 into the RAM 8 of the handler 30 and then the test is carried out. Alternatively, without having written previously the input data into the floppy disk, the operator directly inputs to the RAM 8 various test conditions for one lot which is to undergo a test using the keyboard 10, and then the test is carried out.

The number of the test conditions becomes up to 20 major items in case other conditions of (5) described above are included. Since an operator inputs the test conditions for each lot using the keyboard 10, there is a problem that input errors tend to occur. For example, if an error (a miss on inputting) occurs in setting of a temperature in the constant temperature chamber 34, the temperature specified by the temperature condition cannot be set, and a useless test is performed. Also, when a retest is requested by the IC tester 1 based on the data of the test results, or in case the operator becomes aware of a miss on inputting and wish to retest, the operator needs to create a retest schedule (procedure or program) by his (her) own judgement, and then the operator need to input to the handler 30 when the retest is to be carried out and at the same time, to take out a customer tray 31 loaded with ICs to be retested thereon from the unloader rack section 4a and to set it to the loader rack section 3a. Consequently, there are disadvantages that the operator's work load is increased and the test efficiency of the system is decreased.

SUMMARY OF THE INVENTION

It is an object of the present invention to provide a handler in which an operator can easily input the test conditions for ICs of each lot.

An another object of the present invention is to provide a handler which makes it possible to realize an automatic scheduling of a retest.

A further object of the present invention is to provide a handler which can set automatically a tray loaded with ICs which are needed to retest from the unloader rack section to the loader section.

It is a still further object of the present invention to provide a handler which is able to reduce the operator's intervention and to increase the test efficiency of the system.

In accordance with the present invention, there is provided a handler which comprises: a test parameter memory part for storing, as the test conditions for devices (ICs) to be tested of each lot, at least parameters of basic conditions of operation, parameters of classifying conditions for the tested devices, at least one parameter of socket (contact pin) selecting conditions, and parameters of temperature conditions; a parameter set memory part for storing a plurality of parameter sets each set of which is a combination of parameters one for one condition stored in the test parameter memory part; a schedule memory part for storing a name of each lot, and a parameter set and a status (one of "test reserved", "under test", "test completed" and "under retest") corresponding to each lot name in testing sequence; a lot data memory part for storing data of the test results for each lot sent from an IC tester; a retest data memory part for storing retest data including a parameter set for devices to be retested; and a control part for controlling various sections and parts of the handler.

In a preferred embodiment of the present invention, the control part comprises: a lot status control part for defining status of each lot and controlling the operation of each part or section in accordance with a corresponding schedule stored in the schedule memory part; and a schedule management part for performing, under the control of the lot status control part, a registration, update, and deletion of a schedule in the schedule memory part, and a registration and an interruption of a lot to be retested, and editing the retest data including the parameter set to write the data in the retest data memory part.

In addition, the handler further comprises a tray transporting section having a function of carrying a tray loaded thereon with devices to be tested from the loader rack section to a device transferring section of the loader section, a function of transporting a tray loaded thereon with tested devices which have been sorted out on the basis of the data of the test results from a device transferring section of the unloader section to the unloader rack section, and a function of transporting a tray loaded thereon corresponding tested devices from the unloader rack section to the device transferring section of the loader section.

BRIEF DESCRIPTION OF THE DRAWINGS

FIG. 2A is a diagram illustrating an example of a parameter set registered in the parameter set memory part 8b of FIG. 1;

FIG. 2B is a diagram illustrating an example of a schedule inputted to the schedule memory part 8c of FIG. 1;

FIG. 4A is a diagram illustrating an example of a schedule of interruption stored in the schedule memory part 8c of FIG. 1;

FIG. 4B is a diagram illustrating an example of a schedule of retest process stored in the schedule memory part 8c of FIG. 1;

FIG. 8 is a diagram illustrating an example of various test conditions and respective classification types; and FIG. 9 is a diagram illustrating an example of a test data file written in the RAM 8 of FIG. 6 for each lot to be tested.

DESCRIPTION OF THE PREFERRED EMBODIMENTS

Now, a preferred embodiment of the invention will be described in detail with reference to the accompanying drawings.

Figure 1:
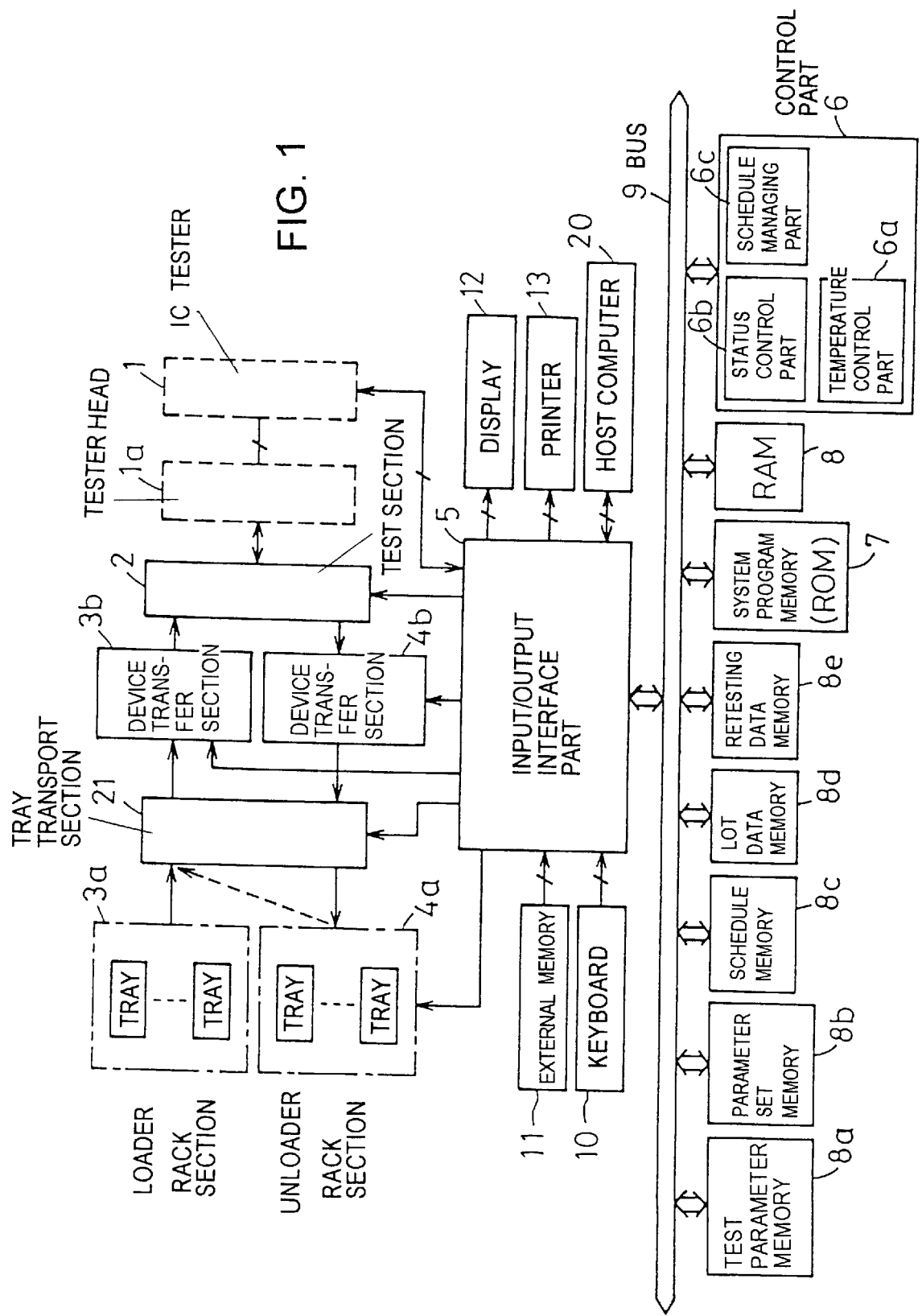
FIG. 1 is a block diagram showing an embodiment of the handler according to the present invention.
Figure 5:
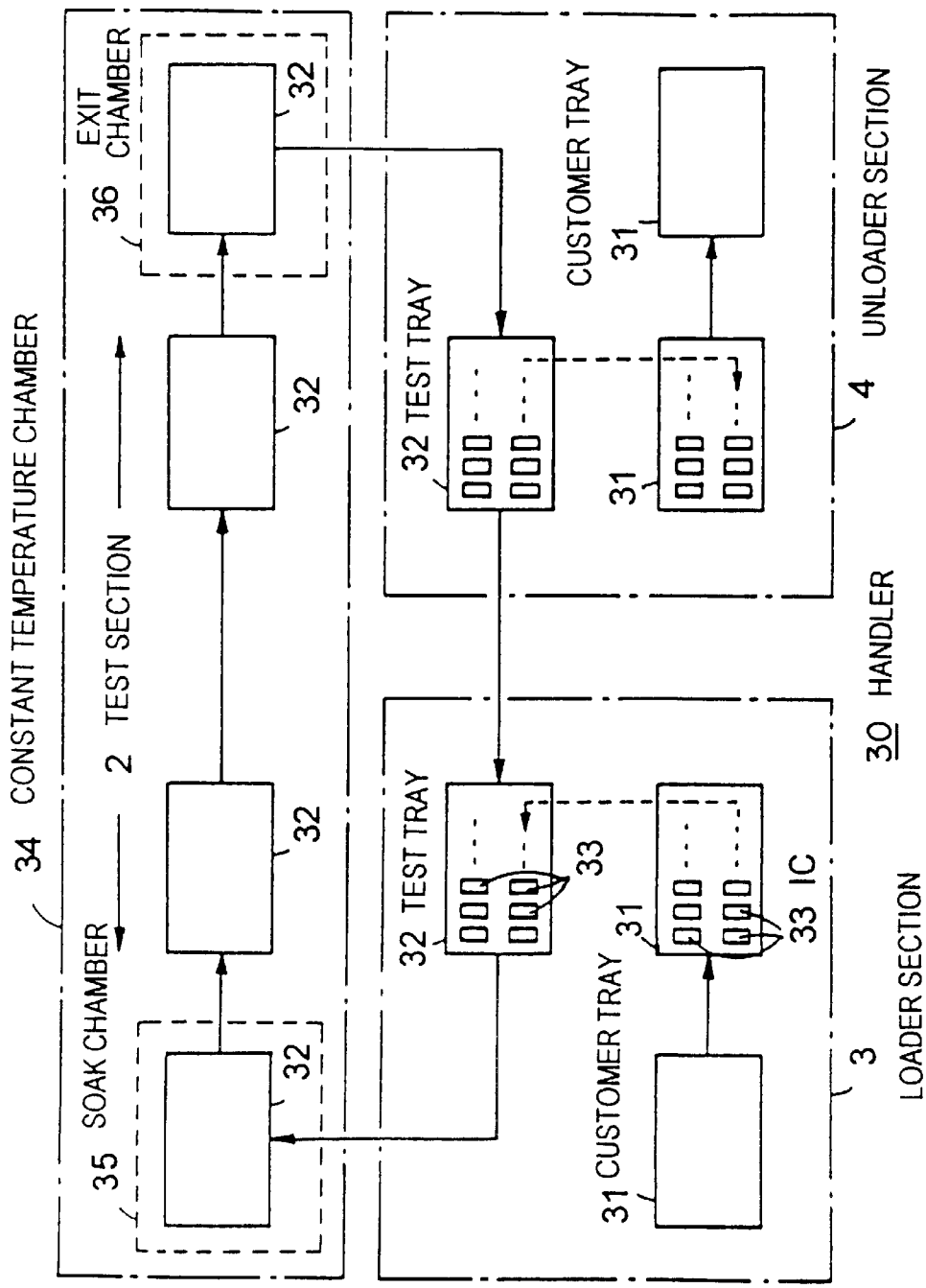
FIG. 5 is an illustration showing, in flow chart manner, a prior art handler of horizontal transporting system.
Figure 6:
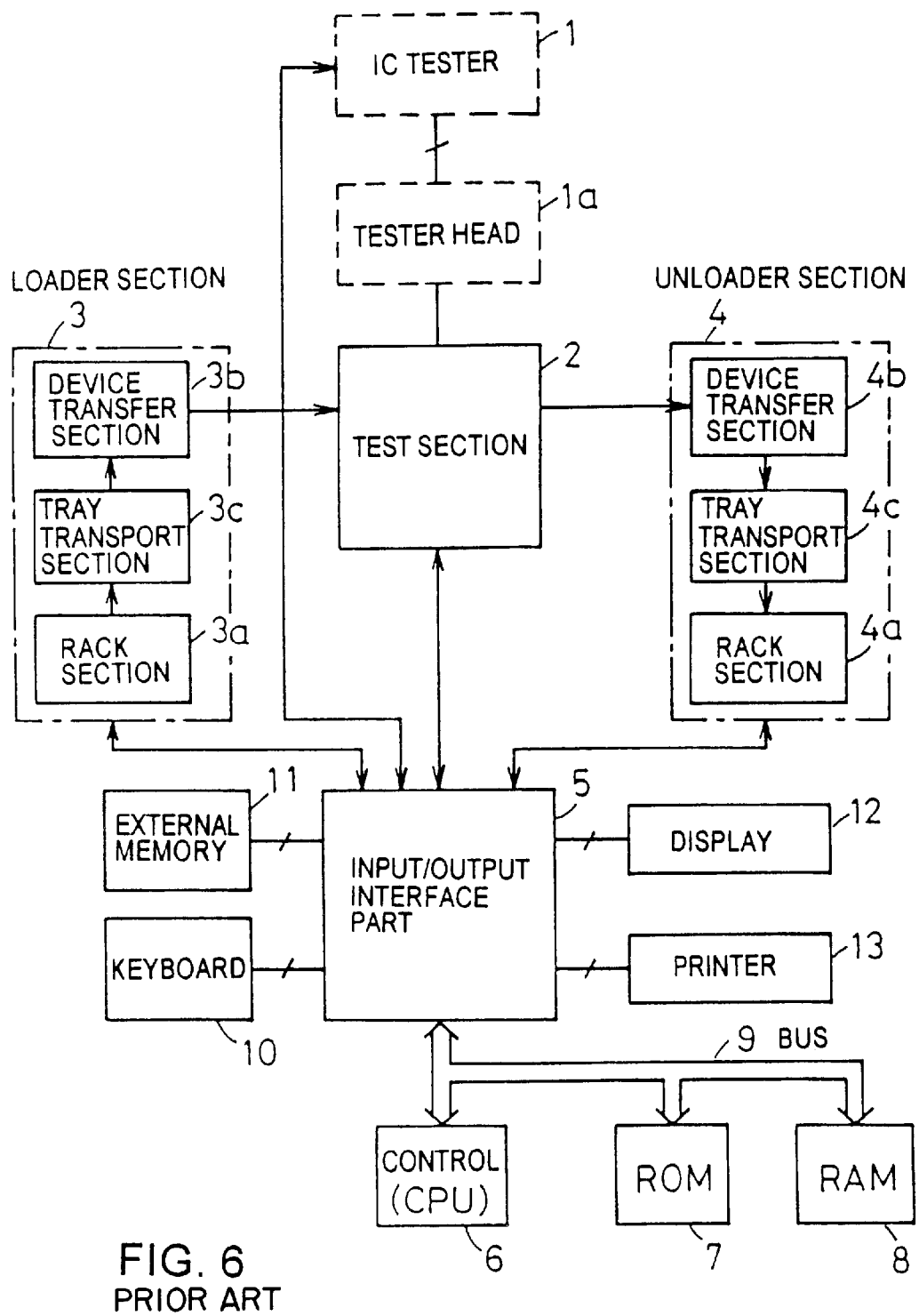
FIG. 6 is a block diagram showing a construction of the prior art handler of FIG. 5.
Figure 7:
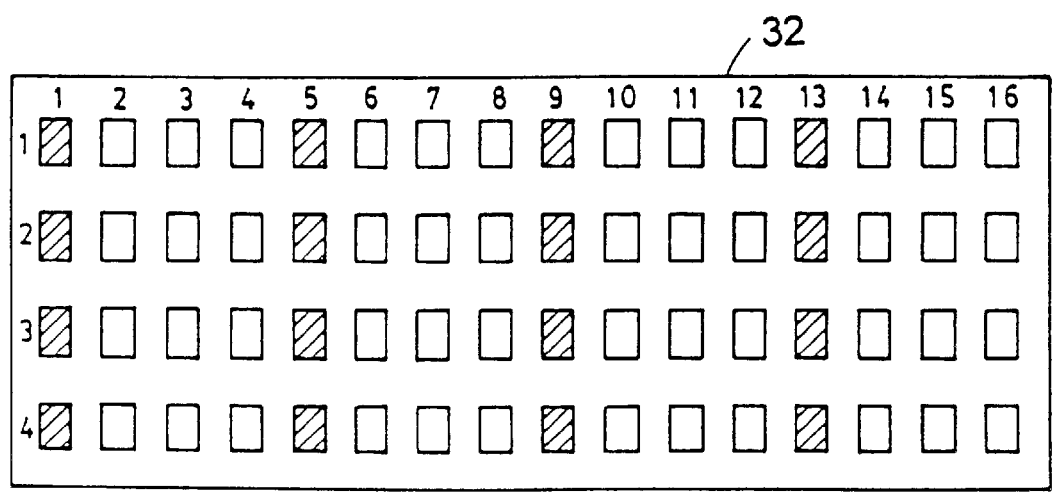
FIG. 7 is a plan view showing an example of a test tray used in the handler.

FIG. 1 shows an embodiment of the handler according to the present invention. For clarity of the explanation, the portions in FIG. 1 corresponding to those in FIGS. 5 and 6 have the same reference characters affixed, and the explanation thereof will be omitted unless needed.

In this embodiment, the handler comprises a tray transporting section 21 having three functions (or mechanisms) in combination one of which is a tray transporting function (or mechanism) of taking out one customer tray from the loader rack section 3a in which a plurality of customer trays each loaded thereon with ICs to be tested are stored in the form of a stack, for example, on the top of the stack of customer trays and transporting it to a device transferring section 3b of the loader section 3, the second of which is a tray transporting function (or mechanism) of transporting a customer tray loaded thereon with tested ICs which have been sorted out on the basis of the data of the test results in a device transferring section 4b of the unloader section 4 from the device transferring section to the unloader rack section 4a, and the third of which is a tray transporting function (or mechanism) of transporting a customer tray loaded thereon the tested ICs from the unloader rack section 4a to the device transferring section 3b of the loader section 3.

The I/O interface part 5 has a host computer 20 connected thereto, and further, a test parameter memory part 8a, a parameter set memory part 8b, a schedule memory part 8c, a lot data memory part 8d and a retesting data memory part 8e are connected to the I/O interface part 5 through the bus 9. The control part 6 comprises a temperature control part 6a, a status control part 6b and a schedule managing part 6c.

In the present invention, plural kinds of combinations of usually used parameters of various test conditions are previously created, each combination (a parameter set) being composed of a plurality of usually used parameters one parameter for one test condition, and these plural kinds of parameter sets are beforehand stored in the parameter set memory part 8b as parameter sets $S_1, S_2, S_3, \ldots$ as shown in FIG. 2A.

This is different from the prior art handler in which in testing ICs of each lot to be tested, a testing data file is created for each lot by combining various test conditions shown in FIG. 8 and an operator inputs each testing data file into the external memory part 11 or RAM 8 using the keyboard 10 thereby creating a testing data file for each lot as shown in FIG. 9.

Accordingly, in the present invention, as shown in FIG. 2B, an operator only inputs, in testing ICs of each lot to be tested, a name of each lot, a status (described later), a test condition (a character or an address of a parameter set $S_i$, etc.), the number of devices (ICs to be tested), and the like into the schedule memory part 8c in the sequence of tests. Therefore, the input of the test condition can be made very easily. Further, the test condition parameters shown in FIG. 8 have been previously stored in the test parameter memory part 8a so that an operator can always utilize them.

In the present invention, the status of each lot is classified into (1) "test reserved", (2) "under test", (3) "test completed", or (4) "under retest", which is incorporated into a schedule. Each lot status is controlled by the status control part 6b of the control part 6. That is, the status control Dart 6b of the control part 6 defines the status of each lot and controls the operation of each part or section of the handler in accordance with the corresponding schedule registered in the schedule memory part 8c.

Figure 3:
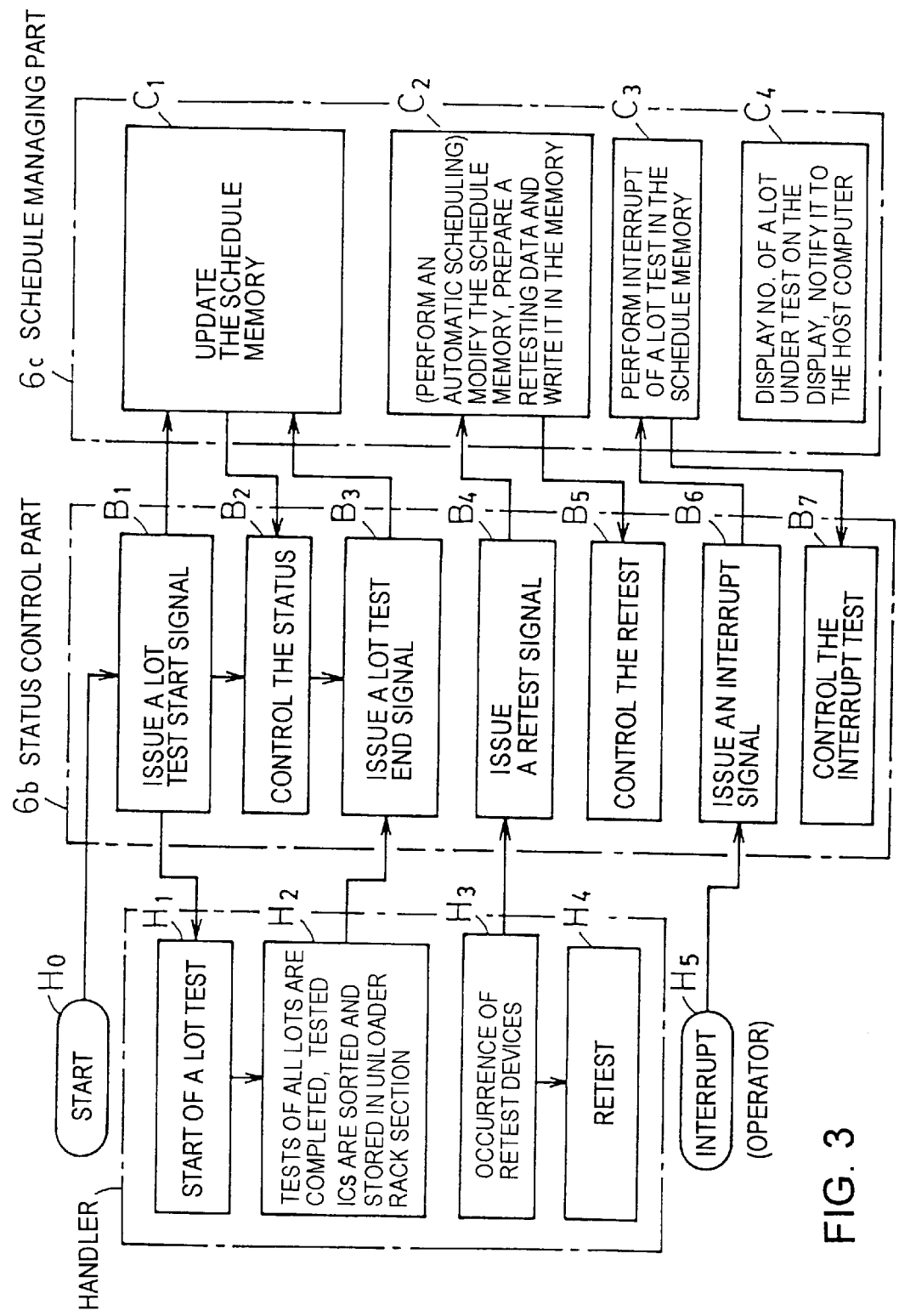
FIG. 3 is a flow chart for explaining the operation of the status control part 6b and the schedule management part 6c of FIG. 1.

In addition, under the control of the status control part 6b, the schedule management part 6c executes update, modification, correction or the like of the schedule memory part 8c. These operations will be described with reference to FIG. 3.

When a start instruction is issued by an operator through a keyboard 10 or by the host computer 20 connected to the I/O interface part 5, the status control part 6b transfers a lot test start signal to the various portions and/or sections of the handler via the I/O interface part 5 (step $B_1$). Thus, a test for ICs of a lot is started (step $H_1$).

Next, the status control part 6b controls the operation of each of the parts and/or sections such that it matches the status of each lot in accordance with the schedule stored in the schedule memory part 8c (step $B_2$).

The schedule management part 6c sequentially updates the schedule stored in the schedule memory part 8c on the basis of the status control of the status control part 6b. That is, the schedule management part 6c updates the status of the schedule for each lot such as "test reserved", "under test", "test completed", or "under retest" (step $C_1$).

When the test for ICs of all lots is completed, the tested ICs are sorted out by categories and loaded on corresponding customer trays in the unloader section 4, and the customer trays each having tested ICs loaded thereon are accommodated in the unloader rack section 4a (step $H_2$), the status control part 6b issues a lot test end signal (step $B_3$). On issuance of the lot test end signal, the schedule management part 6c changes the status of the schedules of all the lots stored in the schedule memory part 8c into the status of "test completed" (tested). Further, the data of the test results of the ICs of each lot transferred from the IC tester 1 is stored in the lot data memory part 8d.

In case, after a test for one lot has been completed, a retest for the tested ICs of that lot is requested from, for example, the temperature control part 6a of the control part 6 for controlling the temperature of the constant temperature chamber 34, or after tests for all the lots have been completed, a retest for the tested non-conforming ICs is requested from the IC tester side (step $H_3$), the status control part 6b issues a retest signal (step $B_4$). The schedule management part 6c performs, as shown in FIG. 4B, an interrupt registration of a schedule (No. 5 in FIG. 4B) of the lot to be retested into the schedules stored in the schedule memory part 8c as well as edits data (parameter set, etc.) necessary for the retest depending on the content or degree of failure of the tested ICs to write the edited data in the retest memory part 8e (step $C_2$). That is, an automatic scheduling is effected. The status control part 6b controls the operation of each part and/or section in accordance with the contents written in the retest memory part 8e (step $B_5$).

When an interrupt request that a test for ICs of a new lot should be done is inputted by an operator via the keyboard 10 (step $H_5$), the status control part 6b issues an interrupt signal (step B6). As shown in FIG. 4A, the schedule management part 6c executes an additional registration of a requested schedule (No. 4 in FIG. 4A) of the new lot into the schedules of the schedule memory part 8c (step $C_3$), and the status control part 6b then controls the status of each lot based on the interrupt schedule that has been additionally registered (step $B_7$). That is, a test for the new lot is carried out. The interrupt procedure described above is also performed in the case that a request for retest is issued in the midway of the above-mentioned lot test, thereby to execute the interrupt registration of a retest schedule into the registered schedules as a retest lot, as shown in FIG. 4B, by a judgement of the schedule management part 6c.

Further, the schedule management part 6c serves to cause a lot number of the lot which is under test to be indicated on the display 12 and/or to inform the host computer 20 of the lot number (step $C_4$).

In case of retesting, in the prior art handler, an operator need to manually take out a customer tray loaded thereon with the corresponding tested ICs from the unloader rack section 4a and to move it to the loader rack section 3a. However, in the present invention, there is provided a tray transporting section 21 which transports a customer tray from the unloader rack section 4a for accommodating customer trays each having corresponding tested ICs loaded thereon to the device transferring section 3b of the loader section 3, the customer tray transported by the tray transporting section 21 being loaded with the tested ICs sorted out based on the data of the test results.

Based on that the status control part 6b controls the operation of each part and/or section in accordance with the contents written in the retest memory part 8e in the above step $B_5$, the tray transporting section 21 selects the corresponding customer tray (for example, if there are a non-conforming tray A, a non-conforming tray B, a non-conforming tray C, . . . , only a non-conforming tray A is selected) in the unloader rack section 4a and transports it to the loader device transferring section 3b. The loader device transferring section 3b transfers the tested ICs from the customer tray transported thereto to a test tray 32. Thus, the tested ICs loaded on the test tray is again conveyed into the test section 2 in the constant temperature chamber 34 for testing. Accordingly, with the present invention, the tested ICs can be automatically transported from the unloader rack section 4a to the device transferring section 3b of the loader section 3, and hence it is unnecessary for an operator to manually take out a customer tray loaded thereon with the corresponding tested ICs from the unloader rack section 4a and to move it to the loader rack section 3a.

In such a manner, in the present invention, the tray transporting section 21 is improved such that it has not only functions of both the loader tray transporting section 3c and the unloader tray transporting section 4c in the prior art handler but also a function capable of automatically transporting a customer tray loaded thereon with the tested ICs from the unloader rack section 4a to the loader device transferring section 3b under the control of the status control part 6b without any operator's intervention. Therefore, the amount of operator's works can be reduced and also the efficiency in test of the system can be improved.

Moreover, in the present invention, different combinations of parameters such as basic operation conditions, classifying conditions, socket selection conditions, temperature conditions, and the like are previously registered as parameter sets ($S_1$–$S_n$) in the parameter set memory part 8b. Therefore, in testing ICs to be tested of all the lots, an operator merely inputs in the schedule memory part 8c the names of the lots, the status, the names of parameter sets (characters or addresses of the parameter sets $S_i$), the number of devices (ICs to be tested), and the like in testing sequence. Therefore, the operator need not create a data file of test conditions for each lot using the keyboard 10 each time a test for a lot is performed as in the prior art handler, and consequently, an input operation of the test conditions can be done very simply and also input errors can be greatly reduced. In addition, by previously storing in the schedule memory part 8c a test schedule such as the name, the status, the number of ICs to be tested, etc. of each lot, the operator only inputs the name of parameter set or address of each lot in performing all the test schedules stored in the schedule memory part 8c, and hence the input operation of test conditions can be simplified more and more.

Further, in the prior art handler, an operator creates a scheduling of retest and a retesting data, and inputs them into the handler. In the present invention, the schedule management part 6c can automatically create a scheduling of retest and a retesting data under the control of the status control part 6b and can automatically make a correction or modification of a schedule stored in the schedule memory part 8c as well as can automatically register the scheduling of retest and the retesting data in the retesting data memory part 8e. That is, an automatic scheduling can be effected. Thus, the operator's works can be remarkably decreased and the efficiency in test of the system can be improved.

Since the tray transporting section 21 can transport a customer tray on which ICs to be retested are loaded from the unloader rack section 4a to the loader device transferring section 3b under control of the status control part 6b, a retesting can be performed without any operator's intervention. Accordingly, the necessity of the operator's intervention is significantly reduced in the handler of the present invention as compared with the prior art handler, and the saving of labor can be achieved and the test efficiency can be improved by the automated handling.

In the foregoing the present invention has been described with reference to ICs which are a typical example of semiconductor devices. However, it is needless to say that the present invention can be also applied to semiconductor devices other than ICs and that the same function and effects can be obtained.

What is claimed is:

1. A semiconductor device transporting and handling apparatus transporting semiconductor devices to be tested from a loader section to a test section in a constant temperature chamber in which the devices are tested by a semiconductor device testing apparatus to obtain data of test results, and upon completion of the test in the test section, transporting the tested devices out of the test section to an unloader section, and sorting out the tested devices into conforming articles and non-conforming articles on the basis of the data of the test results, said transporting and handling apparatus comprising:

a bus:

a test parameter memory part coupled to the bus and storing parameters of basic conditions of operation, parameters of classifying conditions for the tested devices, parameters of socket selecting conditions in the test section, and parameters of temperature conditions for the constant temperature chamber;

a parameter set memory part coupled to the bus and storing a plurality of parameter sets, each set of which is a combination of the parameters, each of which represents each of the different conditions stored in said test parameter memory part;

a schedule memory part coupled to the bus and storing a name of each lot, and a parameter set and a status both of which correspond to each lot name in testing sequence;

a lot data memory part coupled to the bus and storing the data of the test results for each lot;

a retest data memory part coupled to the bus and storing retest data including a parameter set for devices to be retested; and a control part coupled to the bus and controlling the transporting and handling apparatus.

2. The transporting and handling apparatus according to claim 1, further comprising:

an input/output interface part;

a loader rack section storing trays each loaded thereon with devices to be tested;

an unloader rack section coupled to the input/output interface part and storing trays each loaded thereon with tested devices which have been sorted out on the basis of the data of the test results; and a tray transporting section coupled to the input/output interface part, to the loader rack section, and to the unloader rack section and carrying a tray loaded thereon with devices to be tested from said loader rack section to a device transferring section of the loader section, transporting a tray loaded thereon with tested devices which have been sorted out on the basis of the data of the test results from a device transferring section of the unloader section to said unloader rack section, and transporting a tray loaded thereon with corresponding tested devices from the unloader rack section to the device transferring section of the loader section.

3. The transporting and handling apparatus according to claim 1, wherein said control part comprises:

a lot status control part defining a status of each lot to one of "test reserved", "under test", "test completed" and "under retest", and controlling the operation of each part and section of the transporting and handling apparatus in accordance with a corresponding schedule stored in said schedule memory part, and a schedule management part performing, under the control of said lot status control part, a registration, update, and deletion of a schedule in said schedule memory part, and a registration and insertion of a lot to be retested, and editing the retest data including the parameter set and writing the thus edited retest data in said retest data memory part.

4. The transporting and handling apparatus according to claim 3, wherein said control part further comprises a temperature control part controlling temperature of the constant temperature chamber.

5. The transporting and handling apparatus according to claim 3, further comprising:

an input/output interface part;

a loader rack section storing trays each loaded thereon with devices to be tested;

an unloader rack section coupled to the input/output interface part and storing trays each loaded thereon with tested devices which have been sorted out on the basis of the data of the test results; and a tray transporting section coupled to the input/output interface part, to the loader rack section, and to the unloader rack section and carrying a tray loaded thereon with devices to be tested from said loader rack section to a device transferring section of the loader section, transporting a tray loaded thereon with tested devices which have been sorted out on the basis of the data of the test results from a device transferring section of the unloader section to said unloader rack section, and transporting a tray loaded thereon with corresponding tested devices from the unloader rack section to the device transferring section of the loader section.

6. A semiconductor device transporting and handling apparatus transporting semiconductor devices to be tested from a loader section to a test section in a constant temperature chamber and transporting the tested devices out of the test section, said transporting and handling apparatus comprising:

a bus;

a test parameter memory coupled to the bus and storing, as the test conditions for devices to be tested of each lot, different kinds of parameters including parameters of basic conditions of operation, parameters of classifying conditions for the tested devices, parameters of socket selecting conditions in the test section, and parameters of temperature conditions for the constant temperature chamber;

a parameter set memory coupled to the bus and storing a plurality of parameter sets, each set of which is a combination of parameters preselected among parameters of different conditions stored in said test parameter memory;

a schedule memory coupled to the bus and storing a plurality of schedules each including a name of each lot, and a parameter set and a status corresponding to each lot name in testing sequence;

a lot data memory coupled to the bus and storing data of the test results for each lot;

a retest data memory coupled to the bus and storing retest data including a parameter set for devices to be retested; and a control part coupled to the bus and controlling the transporting and handling apparatus in accordance with the schedules in the schedule memory.

7. The transporting and handling apparatus according to claim 6, wherein said control part comprises:

a lot status control part defining a status of each lot to one of "test reserved", "under test", "test completed" and "under retest", and controlling the operation of each part and section of the transporting and handling apparatus in accordance with a corresponding schedule stored in said schedule memory part in testing sequence, and a schedule management part performing, under the control of said lot status control part, registration, update, and deletion of a schedule of a lot to be tested and registration and insertion of a lot to be retested in said schedule memory part, as well as editing the retest data including the parameter set and writing the thus edited retest data in said retest data memory part.

8. A semiconductor device transporting and handling apparatus wherein semiconductor devices to be tested are transported from a loader section to a test section in which the thus transported semiconductor devices are tested by a test apparatus to obtain data of test results, and the thus tested devices are then transported out of the test section to an unloader section in which the tested semiconductor devices are sorted into different categories on the basis of the data of the test results, said transporting and handling apparatus comprising:

a bus;

a parameter set memory coupled to the bus and storing a plurality of parameter sets, each set of which is a combination of different kinds of parameters preselected among parameters of basic conditions of operation, parameters of classifying conditions for the tested devices, parameters of socket selecting conditions in the test section and parameters of temperature conditions for the constant temperature chamber;

a schedule memory coupled to the bus and storing in testing sequence a plurality of schedule data files each including a name of each lot, a parameter set selected from the plurality of the parameter sets stored in the parameter set memory, and a status, both said selected parameter set and said status corresponding to each lot name;

a lot data memory coupled to the bus and storing the data of the test results for each lot; and a control part coupled to the bus and controlling the transporting and handling apparatus in accordance with the schedules stored in the schedule memory.

9. The transporting and handling apparatus according to claim 8, further comprising a test parameter memory coupled to the bus and storing parameters of different kinds of conditions including basic conditions of operation, classifying conditions for the tested devices, socket selecting conditions in the test section, and temperature conditions for the test section, wherein each said parameter set is a combination of parameters selected from the parameters of the different kind of conditions, stored in the test parameter memory.

10. The transporting and handling apparatus according to claim 8, wherein said control part further comprises a temperature control part controlling temperature of the test section.

11. The transporting and handling apparatus according to claim 8, wherein each of said parameter sets is a combination of parameters representing different kinds of conditions selected from a group including basic conditions of operation, classifying conditions for the tested devices, socket selecting conditions in the test section, and temperature conditions for the test section.

12. The transporting and handling apparatus according to claim 8, wherein said control part comprises:

a lot status control part defining the status in each schedule data file of each lot to one of "test reserved", "under test", "test completed" and "under retest", and controlling the operation of said transporting and handling apparatus in accordance with a corresponding schedule data file stored in said schedule memory part, and a schedule management part coupled to the lot status control part and performing, under the control of said lot status control part, registration, update, and deletion of the schedule data file in said schedule memory part.

13. The transporting and handling apparatus according to claim 12, further comprising:

a retest data memory coupled to the bus and storing retest data including a parameter set for devices to be retested, wherein said schedule management part further performs, under the control of said lot status control part, a registration and insertion of a retesting schedule of a lot to be retested, as well as edits the retest data including the parameter set and stores the thus edited data in said retest data memory part, and said lot status control part further controls the operation of said transporting said handling apparatus to perform retest operation in accordance with the retesting schedule in refering to the retest data stored in the retest data memory.

* * * * *

UNITED STATES PATENT AND TRADEMARK OFFICE
CERTIFICATE OF CORRECTION

PATENT NO. : 6,078,188
DATED : June 20, 2000
INVENTOR(S) : Kuniaki Bannai, et al.

It is certified that error appears in the above-identified patent and that said Letters Patent is hereby corrected as shown below:

<u>Column 14,</u>
Line 42, change "said" (second occurrence) to -- and --.

Signed and Sealed this

Eighteenth Day of September, 2001

*Attest:*

*Nicholas P. Godici*

NICHOLAS P. GODICI
*Attesting Officer*     *Acting Director of the United States Patent and Trademark Office*